US007853855B1

(12) United States Patent
He

(10) Patent No.: US 7,853,855 B1
(45) Date of Patent: *Dec. 14, 2010

(54) HIGH SPEED ITERATIVE DECODER

(75) Inventor: Runsheng He, Sunnyvale, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

This patent is subject to a terminal disclaimer.

(21) Appl. No.: 12/538,953

(22) Filed: Aug. 11, 2009

Related U.S. Application Data

(63) Continuation of application No. 11/372,821, filed on Mar. 10, 2006, now Pat. No. 7,577,892.

(60) Provisional application No. 60/711,164, filed on Aug. 25, 2005.

(51) Int. Cl.
*H03M 13/00* (2006.01)

(52) U.S. Cl. .................. 714/755; 714/786; 714/774

(58) Field of Classification Search ............ 714/755, 714/786, 774
See application file for complete search history.

(56) References Cited

U.S. PATENT DOCUMENTS

| | | | |
|---|---|---|---|
| 3,297,951 A | 1/1967 | Blasbalg |
| 3,500,215 A | 3/1970 | Leuthold et al. |
| 3,521,170 A | 7/1970 | Leuthold et al. |
| 3,543,009 A | 11/1970 | Voelcker |
| 3,793,589 A | 2/1974 | Puckette |
| 3,973,089 A | 8/1976 | Puckette |
| 4,071,842 A | 1/1978 | Tewksbury |
| 4,112,253 A | 9/1978 | Wilhelm |
| 4,131,767 A | 12/1978 | Weinstein |
| 4,152,541 A | 5/1979 | Yuen |
| RE30,111 E | 10/1979 | Blood, Jr. |
| 4,295,218 A | 10/1981 | Tanner |
| 4,309,673 A | 1/1982 | Norberg et al. |
| 4,362,909 A | 12/1982 | Snijders et al. |
| 4,393,370 A | 7/1983 | Hareyama |
| 4,393,494 A | 7/1983 | Belforte et al. |
| 4,408,190 A | 10/1983 | Nagano |
| 4,464,545 A | 8/1984 | Werner |

(Continued)

FOREIGN PATENT DOCUMENTS

JP 62-159925 7/1986

(Continued)

OTHER PUBLICATIONS

U.S. Appl. No. 09/559,186, filed Apr. 27, 2000, Nazari et al.

(Continued)

*Primary Examiner*—Guy J Lamarre

(57) ABSTRACT

A system includes a clock having a clock frequency. A first buffer configured to buffer a plurality of encoded data frames. An iterative decoder configured to iteratively decode, in accordance with the clock frequency. A first encoded data frame of the plurality of encoded data frames buffered in the first buffer. The iterative decoder generates a confidence result. The iterative decoder compares the confidence result to a predetermined value. The iterative decoder stops iteratively decoding the first encoded data frame based on the comparison of the confidence result to the predetermined value or based on a total number of decoding iterations. The clock frequency of the clock is based on a total number of encoded data frames buffered in the first buffer.

12 Claims, 6 Drawing Sheets

U.S. PATENT DOCUMENTS

| | | |
|---|---|---|
| 4,503,421 A | 3/1985 | Hareyama et al. |
| 4,527,126 A | 7/1985 | Petrich et al. |
| 4,535,206 A | 8/1985 | Falconer |
| 4,591,832 A | 5/1986 | Fling et al. |
| 4,601,044 A | 7/1986 | Kromer, III et al. |
| 4,605,826 A | 8/1986 | Kanemasa |
| 4,621,172 A | 11/1986 | Kanemasa et al. |
| 4,621,356 A | 11/1986 | Scipione |
| 4,626,803 A | 12/1986 | Holm |
| 4,715,064 A | 12/1987 | Claessen |
| 4,727,566 A | 2/1988 | Dahlquist |
| 4,816,830 A | 3/1989 | Cooper |
| 4,817,081 A | 3/1989 | Wouda et al. |
| 4,868,571 A | 9/1989 | Inamasu |
| 4,878,244 A | 10/1989 | Gawargy |
| 4,888,762 A | 12/1989 | Arai |
| 4,894,820 A | 1/1990 | Miyamoto et al. |
| 4,935,919 A | 6/1990 | Hiraguchi |
| 4,947,171 A | 8/1990 | Pfeifer et al. |
| 4,970,715 A | 11/1990 | McMahan |
| 4,972,360 A | 11/1990 | Cukier et al. |
| 4,988,960 A | 1/1991 | Tomisawa |
| 4,993,045 A | 2/1991 | Alfonso |
| 4,999,830 A | 3/1991 | Agazzi |
| 5,018,134 A | 5/1991 | Kokubo et al. |
| 5,084,865 A | 1/1992 | Koike |
| 5,119,365 A | 6/1992 | Warner et al. |
| 5,136,260 A | 8/1992 | Yousefi-Elezei |
| 5,148,427 A | 9/1992 | Buttle et al. |
| 5,153,450 A | 10/1992 | Ruetz |
| 5,164,725 A | 11/1992 | Long |
| 5,185,538 A | 2/1993 | Kondoh et al. |
| 5,202,528 A | 4/1993 | Iwaooji |
| 5,204,880 A | 4/1993 | Wurster et al. |
| 5,212,659 A | 5/1993 | Scott et al. |
| 5,222,084 A | 6/1993 | Takahashi |
| 5,243,346 A | 9/1993 | Inami |
| 5,243,347 A | 9/1993 | Jackson et al. |
| 5,245,231 A | 9/1993 | Kocis et al. |
| 5,245,654 A | 9/1993 | Wilkison et al. |
| 5,248,956 A | 9/1993 | Himes et al. |
| 5,253,249 A | 10/1993 | Fitzgerald et al. |
| 5,253,272 A | 10/1993 | Jaeger et al. |
| 5,254,994 A | 10/1993 | Takakura et al. |
| 5,267,269 A | 11/1993 | Shih et al. |
| 5,269,313 A | 12/1993 | DePinto |
| 5,272,453 A | 12/1993 | Traynor et al. |
| 5,280,526 A | 1/1994 | Laturell |
| 5,282,157 A | 1/1994 | Murphy et al. |
| 5,283,582 A | 2/1994 | Krenik |
| 5,305,379 A | 4/1994 | Takeuchi et al. |
| 5,307,064 A | 4/1994 | Kudoh |
| 5,307,405 A | 4/1994 | Sih |
| 5,323,157 A | 6/1994 | Ledzius et al. |
| 5,325,400 A | 6/1994 | Co et al. |
| 5,357,145 A | 10/1994 | Segaram |
| 5,365,935 A | 11/1994 | Righter et al. |
| 5,367,540 A | 11/1994 | Kakuishi et al. |
| 5,373,147 A | 12/1994 | Noda |
| 5,375,147 A | 12/1994 | Awata et al. |
| 5,388,092 A | 2/1995 | Koyama et al. |
| 5,388,123 A | 2/1995 | Uesugi et al. |
| 5,392,042 A | 2/1995 | Pellon |
| 5,399,996 A | 3/1995 | Yates et al. |
| 5,440,514 A | 8/1995 | Flannagan et al. |
| 5,440,515 A | 8/1995 | Chang et al. |
| 5,444,739 A | 8/1995 | Uesugi et al. |
| 5,465,272 A | 11/1995 | Smith |
| 5,479,124 A | 12/1995 | Pun et al. |
| 5,507,036 A | 4/1996 | Vagher |
| 5,517,435 A | 5/1996 | Sugiyama |
| 5,521,540 A | 5/1996 | Marbot |
| 5,537,113 A | 7/1996 | Kawabata |
| 5,537,444 A | 7/1996 | Nill et al. |
| 5,539,403 A | 7/1996 | Tani et al. |
| 5,539,773 A | 7/1996 | Knee et al. |
| 5,557,027 A | 9/1996 | Kemp |
| 5,559,476 A | 9/1996 | Zhang |
| 5,568,064 A | 10/1996 | Beers et al. |
| 5,568,142 A | 10/1996 | Velazquez et al. |
| 5,572,159 A | 11/1996 | McFarland |
| 5,577,027 A | 11/1996 | Cheng |
| 5,579,004 A | 11/1996 | Linz |
| 5,585,802 A | 12/1996 | Cabler et al. |
| 5,589,788 A | 12/1996 | Goto |
| 5,596,439 A | 1/1997 | Dankberg et al. |
| 5,600,321 A | 2/1997 | Winen |
| 5,613,233 A | 3/1997 | Vagher |
| 5,625,357 A | 4/1997 | Cabler |
| 5,629,652 A | 5/1997 | Weiss |
| 5,651,029 A | 7/1997 | Yang et al. |
| 5,659,609 A | 8/1997 | Koizumi et al. |
| 5,663,728 A | 9/1997 | Essenwanger |
| 5,666,354 A | 9/1997 | Cecchi et al. |
| 5,684,482 A | 11/1997 | Galton |
| 5,687,330 A | 11/1997 | Gist et al. |
| 5,696,796 A | 12/1997 | Poklemba |
| 5,703,541 A | 12/1997 | Nakashima |
| 5,719,515 A | 2/1998 | Danger |
| 5,726,583 A | 3/1998 | Kaplinsky |
| 5,745,564 A | 4/1998 | Meek |
| 5,757,298 A | 5/1998 | Manley et al. |
| 5,757,821 A | 5/1998 | Jamal et al. |
| 5,768,294 A | 6/1998 | Chen et al. |
| 5,790,060 A | 8/1998 | Tesch |
| 5,796,354 A | 8/1998 | Cartabiano et al. |
| 5,796,725 A | 8/1998 | Muraoka |
| 5,798,661 A | 8/1998 | Runaldue et al. |
| 5,812,597 A | 9/1998 | Graham et al. |
| 5,821,892 A | 10/1998 | Smith |
| 5,822,426 A | 10/1998 | Rasmus et al. |
| 5,825,819 A | 10/1998 | Cogburn |
| 5,834,860 A | 11/1998 | Parsons et al. |
| 5,838,177 A | 11/1998 | Keeth |
| 5,838,186 A | 11/1998 | Inoue et al. |
| 5,841,386 A | 11/1998 | Leduc |
| 5,841,809 A | 11/1998 | Koizumi et al. |
| 5,859,552 A | 1/1999 | Do et al. |
| 5,864,587 A | 1/1999 | Hunt |
| 5,880,615 A | 3/1999 | Bazes |
| 5,887,059 A | 3/1999 | Xie et al. |
| 5,892,317 A | 4/1999 | Mukohjima et al. |
| 5,894,496 A | 4/1999 | Jones |
| 5,898,340 A | 4/1999 | Chatterjee et al. |
| 5,926,232 A | 7/1999 | Mangold et al. |
| 5,930,272 A | 7/1999 | Thesling |
| 5,930,686 A | 7/1999 | Devlin et al. |
| 5,933,462 A | 8/1999 | Viterbi et al. |
| 5,936,450 A | 8/1999 | Unger |
| 5,940,498 A | 8/1999 | Bardl |
| 5,949,362 A | 9/1999 | Tesch et al. |
| 5,949,831 A | 9/1999 | Coker et al. |
| 5,963,069 A | 10/1999 | Jefferson et al. |
| 5,974,540 A | 10/1999 | Morikawa et al. |
| 5,983,385 A | 11/1999 | Khayrallah et al. |
| 5,999,044 A | 12/1999 | Wohlfarth et al. |
| 6,002,716 A | 12/1999 | Meyer et al. |
| 6,005,370 A | 12/1999 | Gustavson et al. |
| 6,009,549 A | 12/1999 | Bliss et al. |
| 6,014,048 A | 1/2000 | Talaga, Jr. et al. |
| 6,021,518 A | 2/2000 | Pelz |
| 6,023,783 A | 2/2000 | Divsalar |
| 6,028,728 A | 2/2000 | Reed |
| 6,037,812 A | 3/2000 | Gaudet |

| | | | | | | |
|---|---|---|---|---|---|---|
| 6,038,266 | A | 3/2000 | Lee et al. | 6,427,220 B1 | 7/2002 | Vityaev |
| 6,043,766 | A | 3/2000 | Hee et al. | 6,438,180 B1 | 8/2002 | Kavcic et al. |
| 6,044,489 | A | 3/2000 | Hee et al. | 6,441,761 B1 | 8/2002 | Viswanathan |
| 6,046,607 | A | 4/2000 | Kohdaka | 6,452,428 B1 | 9/2002 | Mooney et al. |
| 6,047,346 | A | 4/2000 | Lau et al. | 6,462,688 B1 | 10/2002 | Sutardja |
| 6,049,706 | A | 4/2000 | Cook et al. | 6,476,746 B2 | 11/2002 | Viswanathan |
| 6,052,076 | A | 4/2000 | Patton, III et al. | 6,476,749 B1 | 11/2002 | Yeap et al. |
| 6,057,716 | A | 5/2000 | Dinteman et al. | 6,492,922 B1 | 12/2002 | New |
| 6,067,327 | A | 5/2000 | Creigh et al. | 6,501,402 B2 | 12/2002 | Boxho |
| 6,081,918 | A | 6/2000 | Spielman | 6,509,854 B1 | 1/2003 | Morita et al. |
| 6,087,968 | A | 7/2000 | Roza | 6,509,857 B1 | 1/2003 | Nakao |
| 6,094,082 | A | 7/2000 | Gaudet | 6,531,973 B2 | 3/2003 | Brooks et al. |
| 6,100,830 | A | 8/2000 | Dedic | 6,535,987 B1 | 3/2003 | Ferrant |
| 6,137,328 | A | 10/2000 | Sung | 6,539,072 B1 | 3/2003 | Donnelly et al. |
| 6,140,857 | A | 10/2000 | Bazes | 6,539,367 B1 | 3/2003 | Blanksby et al. |
| 6,145,114 | A | 11/2000 | Crozier et al. | 6,556,677 B1 | 4/2003 | Hardy |
| 6,148,025 | A | 11/2000 | Shirani et al. | 6,563,870 B1 | 5/2003 | Schenk |
| 6,150,856 | A | 11/2000 | Morzano | 6,570,931 B1 | 5/2003 | Song |
| 6,154,784 | A | 11/2000 | Liu | 6,577,114 B1 | 6/2003 | Roo |
| 6,161,209 | A | 12/2000 | Moher | 6,581,181 B1 | 6/2003 | Sonu |
| 6,163,283 | A | 12/2000 | Schofield | 6,583,742 B1 | 6/2003 | Hossack |
| 6,163,289 | A | 12/2000 | Ginetti | 6,594,304 B2 | 7/2003 | Chan |
| 6,163,579 | A | 12/2000 | Harrington et al. | 6,608,743 B1 | 8/2003 | Suzaki |
| 6,166,572 | A | 12/2000 | Yamaoka | 6,625,357 B2 | 9/2003 | Bowen et al. |
| 6,172,634 | B1 | 1/2001 | Leonowich et al. | 6,634,007 B1 | 10/2003 | Koetter et al. |
| 6,173,019 | B1 | 1/2001 | Hee et al. | 6,690,742 B2 | 2/2004 | Chan |
| 6,177,896 | B1 | 1/2001 | Min | 6,691,263 B2 | 2/2004 | Vasic et al. |
| 6,182,261 | B1 | 1/2001 | Haller et al. | 6,708,308 B2 | 3/2004 | DeSouza et al. |
| 6,185,263 | B1 | 2/2001 | Chan | 6,714,825 B1 | 3/2004 | Tanaka |
| 6,191,719 | B1 | 2/2001 | Bult et al. | 6,715,121 B1 | 3/2004 | Laurent |
| 6,192,226 | B1 | 2/2001 | Fang | 6,721,379 B1 | 4/2004 | Cranford et al. |
| 6,201,490 | B1 | 3/2001 | Kawano et al. | 6,721,919 B1 | 4/2004 | Morioka et al. |
| 6,201,831 | B1 | 3/2001 | Agazzi et al. | 6,731,748 B1 | 5/2004 | Edgar, III et al. |
| 6,211,716 | B1 | 4/2001 | Nguyen et al. | 6,744,831 B2 | 6/2004 | Chan |
| 6,215,429 | B1 | 4/2001 | Fischer et al. | 6,744,931 B2 | 6/2004 | Komiya et al. |
| 6,219,817 | B1 | 4/2001 | Holman | 6,751,202 B1 | 6/2004 | Henrie |
| 6,223,061 | B1 | 4/2001 | Dacus et al. | 6,774,693 B2 | 8/2004 | Carr |
| 6,236,345 | B1 | 5/2001 | Dagnachew et al. | 6,775,529 B1 | 8/2004 | Roo |
| 6,249,164 | B1 | 6/2001 | Cranford, Jr. et al. | 6,816,097 B2 | 11/2004 | Brooks et al. |
| 6,249,249 | B1 | 6/2001 | Obayashi et al. | 6,823,028 B1 | 11/2004 | Phanse |
| 6,259,680 | B1 | 7/2001 | Blackwell et al. | 6,844,837 B1 | 1/2005 | Sutardja et al. |
| 6,259,745 | B1 | 7/2001 | Chan | 6,897,693 B2 | 5/2005 | Kim |
| 6,259,957 | B1 | 7/2001 | Alexander et al. | 6,912,684 B2 | 6/2005 | Miyata et al. |
| 6,266,367 | B1 | 7/2001 | Strait | 6,940,830 B2 | 9/2005 | Blackwell et al. |
| 6,271,782 | B1 | 8/2001 | Steensgaard-Madsen | 6,990,163 B2 | 1/2006 | Williams |
| 6,289,068 | B1 | 9/2001 | Hassoun et al. | 7,127,007 B2 | 10/2006 | Agazzi |
| 6,295,012 | B1 | 9/2001 | Greig | 7,151,828 B2 | 12/2006 | Blon et al. |
| 6,298,046 | B1 | 10/2001 | Thiele | 7,433,665 B1 | 10/2008 | Roo |
| 6,307,490 | B1 | 10/2001 | Litfin et al. | 2004/0205383 A1 * | 10/2004 | Sawaguchi ............... 714/6 |
| 6,309,077 | B1 | 10/2001 | Saif et al. | 2004/0208312 A1 | 10/2004 | Okuda |
| 6,313,775 | B1 | 11/2001 | Lindfors et al. | | | |
| 6,331,178 | B1 | 12/2001 | Loeb et al. | | | |
| 6,332,004 | B1 | 12/2001 | Chan | | | |

FOREIGN PATENT DOCUMENTS

| | | |
|---|---|---|
| JP | 63-300700 | 12/1988 |
| JP | 05-064231 | 3/1993 |
| JP | 06-097831 | 4/1994 |
| JP | 06-097831 A | 4/1994 |
| JP | 6-276182 | 9/1994 |
| JP | 6-276182 A | 9/1994 |
| JP | 9-55770 | 2/1997 |
| JP | 9-55770 A | 2/1997 |
| JP | 9-270707 | 10/1997 |
| JP | 2001-177409 | 6/2001 |
| JP | 2001-177409 A | 6/2001 |
| JP | 2004164767 | 6/2004 |
| WO | WO 9637050 | 11/1996 |
| WO | WO 99 46867 | 9/1999 |
| WO | WO 0019616 | 4/2000 |
| WO | WO 00/27079 | 5/2000 |
| WO | WO 0028663 A2 | 5/2000 |
| WO | WO 0028663 A3 | 5/2000 |
| WO | WO 0028668 | 5/2000 |
| WO | WO 0028691 | 5/2000 |

| | | | |
|---|---|---|---|
| 6,333,959 B1 | 12/2001 | Lai et al. | |
| 6,339,390 B1 | 1/2002 | Velazquez et al. | |
| 6,340,940 B1 | 1/2002 | Melanson | |
| 6,346,899 B1 | 2/2002 | Hadidi | |
| 6,351,229 B1 | 2/2002 | Wang | |
| RE37,619 E | 4/2002 | Mercer et al. | |
| 6,369,734 B2 | 4/2002 | Volk | |
| 6,370,190 B1 | 4/2002 | Young et al. | |
| 6,373,417 B1 | 4/2002 | Melanson | |
| 6,373,908 B2 | 4/2002 | Chan | |
| 6,377,640 B2 | 4/2002 | Trans | |
| 6,377,683 B1 | 4/2002 | Dobson et al. | |
| 6,385,238 B1 | 5/2002 | Nguyen | |
| 6,385,442 B1 | 5/2002 | Vu et al. | |
| 6,389,077 B1 | 5/2002 | Chan | |
| 6,408,032 B1 | 6/2002 | Lye et al. | |
| 6,411,647 B1 | 6/2002 | Chan | |
| 6,415,003 B1 | 7/2002 | Raghavan | |
| 6,421,377 B1 | 7/2002 | Langberg et al. | |
| 6,421,534 B1 | 7/2002 | Cook et al. | |

| | | |
|---|---|---|
| WO | WO 0028712 | 5/2000 |
| WO | WO 0035094 | 6/2000 |

OTHER PUBLICATIONS

U.S. Appl. No. 09/730,597, filed Dec. 7, 2000, Burd et al.
U.S. Appl. No. 09/730,598, filed Dec. 7, 2000, Wu et al.
U.S. Appl. No. 09/730,603, filed Dec. 7, 2000, Wu et al.
U.S. Appl. No. 09/730,752, filed Dec. 7, 2000, Burd et al.
U.S. Appl. No. 09/737,743, filed Dec. 18, 2000, Sutardja.
U.S. Appl. No. 09/901,507, filed Jul. 9, 2001, Wu et al.
ANSI/IEEE Std 802.11, 1999 Edition; Information technology—Telecommunications and information exchange between systems—Local and metropolitan area networks—Specific requirements—Part 11: Wireless LAN Medium Access Control (MAC) and Physical Layer (PHY) Specifications; LAN/MAN Standards Committee of the IEEE Computer Society; 528 pages.
IEEE Std 802.11a-1999 (Supplement to IEEE Std 802.11-1999) [Adopted by ISO/IEC and redesignated as ISO/IEC 8802-11: 1999/ Amd 1:2000(E)]; Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications High-speed Physical Layer in the 5 GHz Band; LAN/MAN Standards Committee of the IEEE Computer Society; 91 pages.
IEEE Std 802.11b-1999 (Supplement to IEEE Std 802.11-1999 Edition); Supplement to IEEE Standard for Information technology—Telecommunications and information exchange between systems—Local and metropolitan area networks—Specific requirements—Part 11: Wireless LAN Medium Access Control (MAC) and Physical Layer (PHY) specifications: Higher-Speed Physical Layer Extension in the 2.4 GHz Band; LAN/MAN Standards Committee of the IEEE Computer Society; Sep. 16, 1999 IEEE-SA Standards Board; 96 pages.
IEEE Std 802.11g/D2.8, May 2002 (Supplement to ANSI/IEEE Std 802.11, 1999 Edition) DRAFT Supplement to Standard [for] Information Technology—Telecommunications and information exchange between systems—Local and metropolitan area networks—Specific requirements—Part 11: Wireless LAN Medium Access Control (MAC) and Physical Layer (PHY) specifications: Further Higher-Speed Physical Layer Extension in the 2.4 GHz Band; LAN/MAN Standards Committee of the IEEE Computer Society; 53 pages.
802.11n; IEEE P802.11-04/0889r6; Wireless LANs, TGn Sync Proposal Technical Specification; 131 pages.
IEEE Std 802.16-2004 (Revision of IEEE Std 802.16-2001) IEE Standard for Local and metropolitan area networks; Part 16: Air Interface for Fixed Broadband Wireless Access Systems; IEEE Computer Society and the IEEE Microwave Theory and Techniquest Society; Oct. 1, 2004; 893 pages.
802.3ab; IEEE Std 802.3-2002 (Revisiion of IEEE 802.3, 2000 Edition); IEEE Standard for Information technology—Telecommunications and information exchange between systems—local and metropolitan area networks—Specific requirements Part 3: Carrier sense multiple access with collison detection (CSMA/CD) access method and physical layer specifications; IEEE Computer Society; Sponsored by the LAN/MAN Standards Committee; Mar. 8, 2002; 104 pages.
802.3an; Information technology—Telecommunications and information exchange between systems—Local and metropolitan area networks—specific requirements Part 3: Carrier Sense Multiple Access with Collison Detection (CSMA/CD) Access Method and Physical Layer Specifications—Amendment: Physical Layer and Management Parameters for 10 Gb/s Operation—Type 10GBASE-T; Sponsored by the LAN/MAN Standards Committee of the IEEE Computer Society; 2004;145 pages.
A 690-mW 1-Gb/s 1024-b, Rate-1/2 Low-Density Parity-Check Code Decoder; Andrew J. Blanksby and Chris J. Howland; IEEE JOurnal of Solid-State Circuits, vol. 37, No. 3, Mar. 2002; pp. 404-412.
Low-Noise Local Oscillator Design Techniques using a DLL-based Frequency Multiplier for Wireless Applications; George Chien; 2000; 188 pages.
Digital Systems Engineer; William J. Daily and John W. Poulton; Cover page and pp. 390-391.
Coding, Iterative Detection and Timing Recovery for Magnetic Recording Channels; A Dissertation by Zi-Ning Wu; Aug. 1999; 159 pages.
FP 13.5: A 100 Mb/s CMOS 100Base-T4 Fast Ethernet Transceiver for Category 3, 4 and 5 UTP; K. Chan et al; IEEE 1998; pp. 13.5-1-13.5-10.
Low-Density Parity-Check Codes; R. G. Gallager; IRE Transactions on Information Theory; 1962; pp. 21-28.
Low-Density Parity-Check Codes; Robert G. Gallager; 1963; 90 pages.
Gigabit Ethernet 1000Base-T; 1997; 15 pages.
Analysis and Design of Analog Integrated Circuits; Fourth Edition; Paul R. Gray et al; 2001; 7 pages.
A Viterbi Algorithm with Soft-Decision Outputs and its Applications; Joachim Hagenauer and Peter Hoeher; German Aerospace Research Establishment (DLR); 1969 IEEE; pp. 1680-1686.
IEEE 802.20-PD-06, IEEE P 802.20 V14, Jul. 16, 2004, Draft 802.20 Permanent Document, System Requirements for IEEE 802.20 Mobile Broadband Wireless Access Systems—Version 14, 23 pages.
Good Error-Correcting Codes Based on Very Sparse Matrices; David J. MacKay; IEEE Transactions on Information Theory; vol. 45, No. 2, Mar. 1999; pp. 399-431.
Parity Check Codes for Partial Response Channels; Mats Oberg and Paul H. Siegel; Global Telecommunications Conference, 1999 IEEE; pp. 717-722.
Pulse, Digital, and Switching Waveforms, Jacob Millman and Herbert Taub; 1965; 3 pages.
The Capacity of Low-Density Parity-Check Codes Under Message-Passing Decoding; Thomas J. Richardson and R. L. Urbanke; IEEE Transactions on Information Theory; vol. 47, No. 2, Feb. 2001; pp. 599-618.
An ADSL Integrated Active Hybrid Circuit; James Hellums, et al; Texas Instruments Incorporated; 23 pages.
Monolithic CMOS Frequency Synthesizer for Cellular Applications; George Chien and Paul R. Gray; University of California, Berkeley; http://www.eecs.berkeley.edu/~gchien; 9 pages.
TP 12.4: A 900-MHz Local Oscillator using a DLL-based Frequency Multiplier Technique for PCS Applications; George Chien and Paul R. Gray; University of California, Berkeley, CA; 3 pages.
Digital-to-analog Converter having Common-mode Isolation and Differential Output; G. A. Hellwarth and S. Boinodiris; Jul. 19, 1972; pp. 54-60.
An Operational Amplifier Circulator Based on the Weighted Summer; Fuad Surial Atiya; IEEE Transactions on Circuits and Systems, vol. CAS-22, No. 6, Jun. 1975; pp. 516-523.
Combining Echo Cancellation and Decision Feedback Equalization; K. H. Mueller; The Bell System Technical Journal; Feb. 1979, vol. 58, No. 2; Cover page and pp. 491-500.
An 8-bit 2-ns Monolithic DAC; Tsutomu Kamoto et al; IEEE Journal of Solid-State Circuits, vol. 23, No. 1, Feb. 1988; pp. 142-146.
Microelectronic Circuits; Third Edition; Adel S. Sedra and Kenneth C. Smith, University of Toronto; 1991; two cover pages and pp. 48-115.
A Two-Chip 1.5-GBd Serial Link Interface; Richard C. Walker et al; IEEE Journal of Solid-State Circuits, vol. 27, No. 12, Dec. 1992; pp. 1805-1811.
A CMOS Serial Link for Fully Duplexed Data Communication; Kyeongho Lee et al; IEEE Journal of Solid-State Circuits, vol. 30, No. 4, Apr. 1995; pp. 353-364.
FP 12.1: NRZ Timing Recovery Technique for Band-Limited Channels; Bang-Sup Song and David Soo; ISSCC96 Session 12/ Serial Data Communications/Feb. 9, 1996; 3 pages.
FP 12.1: NRZ Timing Recovery Technique for Band-Limited Channels; Bang-Sup Song and David Soo; ISSCC96 Session 12/ Serial Data Communications/Feb. 9, 1996; Slides; 4 pages.
FA 10.7: An Adaptive Cable Equalizer for Serial Digital Video Rates to 400Mb/s; Alan J. Baker; ISSCC96/ Feb. 9, 1996; 3 pages.

The HC-5502X/4X Telephone Subscriber LIne Interface Circuits (SLIC); Application Note; Jan. 1997; AN549.1; Geoff Phillips; 17 pages.

A CMOS MIxed-Signal 100Mb/s Receive Architecture for Fast Ethernet; Ayal Shoval et al; IEEE 1998 Custom Integrated Circuits Conference; pp. 253-256.

FP 13.6: A 10/100Mb/s CMOS Ethernet Transceiver for 10BaseT, 100BaseTX, and 100BaseFX; J. Everitt et al; IEEE 1998; pp. 13.6-1 through 13.6-9.

Delay-Based Monolithic CMOS Frequency Synthesizer for Portable Wireless Applications; George Chien, University of California, Berkeley, CA; Qualifying Exam; May 20, 1998; 28 pages.

A CMOS Transceiver for 10-Mb/s and 100-Mb/s Ethernet; James Everitt et al; IEEE Journal of Solid-State Circuits, vol. 33, No. 12, Dec. 1998; pp. 2169-2177.

MP 2.3 A Mixed-Signal 120MSample/s PRML Solution for DVD Systems; Rex Baird et al; Cirrus Logic; 10 pages.

TP 13.5 A Single-Chip CMOS Direct-Conversion Transceiver for 900 MHz Spread-Spectrum Digital Cordless Phones; Thomas Cho et al; Level One Communications, Inc., San Francisco, CA; 10 pages.

An Integratable 1-2.5Gbps Low Jitter CMOS Transceiver with Built in Self Test Capability; Ah-Lyan Yee et al; Texas Instruments, Inc.; 1999 Symposium on VLSI Circuits Digest of Technical Papers; pp. 45-46.

CODEC for Echo-Canceling, Full-Rate ADSL Modems; Richard K. Hester; IEEE Journal of Solid-State Circuits, vol. 34, No. 12, Dec. 1999; pp. 1973-1985.

WA 18.7 A Combined 10/125Mbaud Twisted-Pair Line Driver with Programmable Performance/Power Features; Ayal Shoval et al; Lucent Technologies, Allentown, PA; 2000 IEEE International Solid-State Circuits Conference; pp. 314-315.

WA 18.3 A Gigabit Transceiver Chip Set for UTP CAT-6 Cables in Digital CMOS Technology; Kamran Azadet et al; DSP and VLSI Systems Research Dept., Bell Labs, Lucent Technologies, Holmdel, NJ; 2000 IEEE International Solid-State Circuits Conference; 9 pages.

Low-Noise Local Oscillator Design Techniques using a DLL-based Frequency Multiplier for Wireless Applications; George Chien; A dissertation; Spring 2000; 178 pages.

WA 18.5 A MIxed-Signal DFE/FFE Receiver for 100Base-TX Applications; N. Patrick Kelly et al; Level One Communications, Inc., Sacramento, CA; 2000 IEEE International Solid-State Circuits Conference; 9 pages.

ADSL Line Driver/Receiver Design Guide, Part 1; Tim Regan; Linear Technology Magazine; Feb. 2000; pp. 26-31.

High Speed Modem Solutions InfoCard 20; Linear Techology; 6 pages.

Doppler Estimation Using a Coherent Ultrawide-Band Random Noise Radar; Ram M. Narayanan; IEEE Transactions on Antennas and Propagation; vol. 48, No. 6, Jun. 2000; pp. 868-878.

WA 18.4 A 3V Low-Power 0.25 mCMOS 100Mb/s Receiver for Fast Ethernet; Omid Shoaei et al; 2000 IEEE International Solid-State Circuits Conference; 10 pages.

Dual Mode Transmitter with Adaptively Controlled Slew Rate and Impedance Supporting Wide Range Data Rates; Hongjiang Song; Intel Corporation; Chandler, Arizona; 2001 IEEE; pp. 321-324.

19.6 A DSP Based Receiver for 1000Base-T PHY; Runsheng He et al; Marvell Semiconductor, Inc.; 2001 IEEE International Solid-State Circuits Conference; 3 pages.

19.7 A CMOS Transceiver Analog Front-End for Gigabit Ethernet over CAT-5 Cables; Pierte Roo et al; Marvell Semiconductor, Inc.; 2001 IEEE International Solid-State Circuits Conference; 4 pages.

A Constant Slew Rate Ethernet Line Driver; David S. Nack and Kenneth C. Dyer; IEEE Journal of Solid-State Circuits, vol. 36, No. 5, May 2001; pp. 854-858.

Active Output Impedance for ADSL Line Drivers; Randy Stephens; Texas Instruments; Application Report, SLOA100—Nov. 2002; 52 pages.

Specifications for Obsolete Product ITU CO/Loop Carrier SLIC; HC-5509B, Aug. 2003; 9 pages.

A 1.2 GHz Programmable DLL-Based Frequency Multipler for Wireless Applications; Chua-Chin Wang et al; IEEE Transactions on Very Large Scale Integration (VLSI) Systems, vol. 12, No. 12, Dec. 2004; pp. 1377-1381.

SP 21.2: A 1.9GHz Single-Chip IF Transceiver for Digital Cordless Phones; Hisayasu et al; 3 pages.

SP 24.6: A 900MHz CMOS LC-Oscillator with Quadrature Outputs; Ahmadreza Rotougraan et al; Electrical Engineering Dept., University of California, Los Angeles, CA; 2 pages.

Analysis of Timing Jitter in CMOS Ring Oscillators; Todd C. Welgandt et al; pp. 27-30.

ANSI INCI TS 263-1995 (R2000) (formerly ANSI X3 263-1995 (R2000); American National Standard for Information Technology—Fibre Distributed Data Interface (FDDI)—Token Ring Twisted Pair Physical Layer Medium Dependent (TP-PMD); Developed by incits; 80 pages.

High-Performance Electrical Signaling; William Dally et al; 6 pages.

On-chip Terminating Resistors for High Speed ECL-CMOS Interfaces; Thaddeus J. Gabara; AT&T Bell Laboratories; pp. 292-295.

Adaptive Impedance Matching; Anees S. Munshi et al; Department of Electrical and Computer Engineering; University of Toronto; pp. 69-72.

PLL/DLL System Noise Analysis for Low Jitter Clock Synthesizer Design; Beomsup Kim et al; pp. 31-34.

Analysis and Design of Analog Integrated Circuits; Fourth Edition; 7 pages.

Integrated Analog-to-Digital and Digital-to-Analog Converters; Rudy Van de Plassche; Philips Research Laboratories, The Kluwer International Series in Engineering and Computer Science; 1994; 33 pages.

A Third Method of Generation and Detection of Single-Sideband Signals; Donald K. Weaver, Jr.; Cover page and pp. 1703-1705; Proceedings of the IRE, vol. 44, No. 12, Dec. 1956.

Digital General of Low-Frequency Sine Waves; Anthony C. Davies; IEEE Transactions on Instrumentation and Measurement, vol. IM-18, No. 2; Jun. 1969; Cover page and pp. 97-105.

Charge-Pump Phase-Lock Loops; Floyd M. Gardner; IEEE Transactions on Communications; vol. Com-28, No. 11, Nov. 1980; pp. 1849-1858.

Micro-Electronic Circuits; Adel S. Sedra; 1982; 2 cover pages, pp. 95-97, 243-244, 246-247.

A New Approach for the Fabrication of Micromechanical Structures; M. Parameswaran et al; Sensors and Actuators, 19 (1989) pp. 289-307.

WP 23.7 A 6.5GHz Monolithic CMOS Voltage-Controlled Oscillator; Tin-Ping Liu; 1999 IEEE International Solid-State Circuits Conference; pp. 404-405, 484.

Si IC-Compatible Inductors and LC Passive Filters; Nguyen, et al; IEEE Journal on Solid State Circuits, vol. 25, No. 4, Aug. 1990; pp. 1028-1031.

A 30-MHz Hybrid Analog/Digital Clock Recovery Circuit in 2-µm CMOS; Beomsup Kim et al; IEEE Journal of Solid-State Circuits, vol. 25, No. 6, Dec. 1990; pp. 1385-1394.

DP83220 CDL Twisted Pair FDDI Transceiver Device; National Semiconductor, Advance Information, Oct. 1992; 10 pages.

TP 9.2: A 900 MHz-Transceiver Chip Set for Dual-Mode Cellular Radio Mobile Terminals; Iconomos A. Joullias et al; ISSCC 93/Session 9/Radio Communication Circuits/Paper TP 9.2; 1993 IEE International Solid-State Circuits Conference; pp. 140-141, 278.

Expermental Results and Modeling Techniques for Substrate Noise in Mixed-Signal Integrated Circuits; David K. Su et al, IEEE Journal of Solid-State Circuits, vol. 28, No. 4, Apr. 1993; pp. 420-430.

Large Suspended Inductors on Silicon and Their Use in a 2-µm CMOS RF Amplifier; J.y.- C. Chang et al; IEEE Electron Device Letters, vol. 14, No. 5, May 1993; pp. 246-248.

A Monolithic 2.3-Gb/s 100-mW Clock and Data Recovery Circuit in Silicon Bipolar Technology; Mehmet Soyner; IEEE Journal of Solid-State Circuits, vol. 28, No. 12, Dec. 1993; pp. 1310-1313.

A Monlithic 480 Mb/s Parallel AGC/Decision/Clock-Recovery Circuit in 1.2-µm CMOS; Timothy H. Hu et al; IEEE Journal of Solid-State Circuits, vol. 28, No. 12, Dec. 1993; pp. 1314-1320.

A Dynamic Line-Termination Circuit for Multireceiver Nets; Michael Dolle; IEEE Journal on Solid-State Circuits, vol. 28, No. 12, Dec. 1993; pp. 1370-1373.

A CMOS Oversampling D/A Converter with a Current-Mode Semidigital Reconstruction Filter; David K. Su; IEEE Journal of Solid-State Circuits, vol. 28, No, 12, Dec. 1993; pp. 1224-1233.

Multifrequency Zero-Jitter Delay-Locked Loop; Avner Efendovich et al; IEEE Journal of Solid-State Circuits; vol. 29, No. 1, Jan. 1996; pp. 67-70.

FA 18.5: A Delay Line Loopfor Frequency Synthesis of De-Skewed Clock; Alex Waizman; ISSCC94/Session 18;High-Performance Logic and Circuit Techniques/Paper FA 18.5; 1994; pp. 298-299.

A 2.5 V CMOS Delay-Locked Loop for an 18 Mbit, 500 Megabyte/s DRAM; Thomas H. Lee et al; IEEE Journal of Solid-State Circuits; vol. 29, No. 12, Dec. 1994; pp. 1491-1496.

Future Directions in Silicon ICs for RF Personal Communication; P.R. Gray et al; IEEE 1995 Custom Integrated Circuits Conference; pp. 83-90.

A CMOS Steering-Current Multiplying Digital-to-Analog Converter; Bernardo G. Henriques et al; Analog Integrated Circuits and Signal Processing; vol. 8, 1995; 1995 Kluwer Academic Publishers; cover page and pp. 145-155.

TA 8.7: A 2.7V GSM Transceiver ICs with On-Chip Filtering; Chris Marshall et al; 1995 IEEE International Solid-State Circuits Conference; 3 pages.

TP 11.1: Direct-Conversion Radio Transceivers for Digital Communications; Assad A. Abidi; 1995 IEEE International Solid-State Circuits Conference; 4 pages.

Progress in High-Speed and High-Resolution CMOS Data Converters; V. Liberali et al; 1995 20th International Conference on Microelectronics; Proceedings vol. 1; cover page and table of contents, pp. 19-28.

A 1.8-GHz CMOS Low-Phase-Noise Voltage-Controlled Oscillator with Prescaler; Jan Craninckx, IEEE Journal of Solid-State Circuits; vol. 30, No. 12, Dec. 1995; pp. 1474-1482.

A 100 Mb/s BiCMOS Adaptive Pulse-Shaping Filter; Ayal Shovel; IEEE Journal on Selected Areas in Communications; vol. 13, No. 9, Dec. 1995; pp. 1692-1702.

A Micromachined Variable Capacitor for Monolithic Low-Noise VCOS; Darrin J. Young; Techhical Digest; Solid-State Sensor and Actuator Workshop; Jun. 3-6, 1996; cover page and pp. 86-89.

Design of a 10-bit 100 MSample/s BiCMOS D/A Converter; Ivan Harald Holger Jergensen et al; 38th Midwest Symposium on Circuits and Systems; Proceedings vol. 2; Aug. 13-16, 1995t; Brazil; cover page and pp. 730-733.

A CMOS Channel-Select Filter for a Direct-Conversion Wireless Receiver; P.J. Chang et al; 1996 Symposium on VLSI Circuits Digest of Technical Papers; pp. 62-63.

Modeling and Analysis of Substrate Coupling in Integrated Circuits; Ranjit Charpurey et al; IEEE Journal of Solid-State Circuits, vol. 31, No. 3, Mar. 1996; pp. 344-353.

Low-Jitter Process-Independent DLL and PLL Based on Self-Biased Techniques; IEEE Journal of Solid-State Circuits; vol. 31, No. 11, Nov. 1996; pp. 1723-1732.

A 3-V, 22-mW Multibit Current-Mode $\Sigma\Delta$ DAC with 100 dB Dynamic Range; Toshihiko Hamasaki et al; IEEE Journal of Solid-State Circuits; Dec. 1996; vol. 31, No. 12; Special Issue of the 1996 ISCC Analog Sensor and Cmomunication Circuits; cover page and pp. 1888-1894.

SP 23.6: A 1.8GHz CMOS Voltage-Controlled Oscillator; Behzad Razavi; ISCC97; Feb. 8, 1997; 2 pages.

Analysis and Optimization of Monolithic Inductors and Transformers for RFf ICs; Ali M. Niknejad et al; IEEE 1997 Custom Integrated Circuits Conference; pp. 375-378.

Monolithic High-Performance Three-Dimensional Coil Inductors for Wireless Communication Applications; pp. 67-70.

SP 23.8: Silicon Bipolar VCO Family for 1.1 to 2.2GHz with Fully-Integrated Tank and Tuning Circuits; Bart Jansen et al; 1997 IEEE International Solid-State Circuits Conference; 3 pages.

FA 7.2: The Future of CMOS Wireless Transceivers; Asad Abidi et al; 1997 IEEE International Solid-State Circuits Conference; 3 pages.

SP 23.7: A Balanced 1.5GHz Voltage Controlled Oscillator with an Integrated LC Resonator; Leonard Dauphinee et al; 1997 International Solid-State Circuit Conference; 3 pages.

A BiCMOS Double-Low-IF Receiver for GSM;Mihai Banu et al; IEEE 1997 Custom Integrated Circuits Conference; pp. 521-524.

A Low-Noise 1.6-GHz CMOS PLL with On-Chip Loop Filter; James Parker and Daniel Ray; IEEE 1997 Custom Integrated Circuits Conference; pp. 407-410.

SA 18.3: A 1.9GHz Wide-Band IF Double Conversion CMOS Integrated Receiver for Cordless Telephone Applications; Jacques C. Rudell et al; IEEE International Solid State Circuits Conference; 3 pages.

Integrated Circuits for Data Transmission Over Twisted-Pair Channels; David A. Johns et al; IEEE Journal of Solid-State Circuits, vol. 32, No. 3, Mar. 1997; 398-406.

A 1.8 GHz Low-Phase-Noise CMOS VCO Using Optimized Hollow Spiral Inductors; Jan Craninckz et al; IEEE Journal of Solid-State Circuits, vol. 32, No. 5, May 1997; pp. 736-744.

A Fully Integrated Low-Noise 1-GHz Frequency Synthesizer Design for Mobile Communication Application; Seog-Jun Lee et al; IEEE Journal of Solid-State Circuits, vol. 32, No. 5, May 1997; pp. 760-765.

Myson Technology MTD972 (Preliminary); 100Base TX PCS/PMA; 1997; 21 pages.

A 1.9 GHz Wide-Band IF Double Conversion CMOS Receiver for Cordless Telephone Applications; Jacques C. Rudell et al; IEEE Journal of Solid-State Circuits; vol. 32, No. 12, Dec. 1997; pp. 2071-2088.

Myson Technology MTD214; Ethernet Encoder/Decoder and 10BaseT Transceiver with Built-in Waveform Shaper; 1997; 11 pages.

High-Speed Electrical Signaling: Overview and Limitations; Mark Horowitz et al; Jan./Feb. 1998 pp. 12-24.

Phase Noise in Multi-Gigahertz CMOS Ring Oscillators; Ali Hajimiri et al; IEEE 1998 Custom Integrated Circuits Conference; pp. 49-52.

Recent Developments in High Integration Multi-Standard CMOS Transceivers for Personal Communication Systems; Jacques C. Rudell et al; 1998; pp. 149-154/.

A Low-Noise RF Voltage-Controlled Oscillator Using On-Chip High-Q Three-Dimensional Coil Inductor and Micromachined Variable Capacitor; Darrin J. Young et al; Solid-State Sensor and Actuator Workshop; Technical Digest; Jun. 8-11, 1998; cover page and pp. 128-131.

FP 14.7: A Fully Integrated 2.7V 0.35µm CMOS VCO for SGHz Wireless Applications; Peter Kinget; 1998; 2 pages.

A Self-Terminating Low-Voltage Swing CMOS Output Driver; Thomas F. Knight; IEEE Journal of Solid-State Circuits, vol. 23, No. 2, Apr. 1988; pp. 457-464.

Numerically Stable Green Function for Modeling and Analysis of Substrate Coupling in Integrated Circuits; Ali M. Niknejad et al; IEEE Transactions on Computer-Aided Design of Integrated Circuits and Systems, vol. 17, No. 4, Apr. 1998; pp. 305-315.

Analysis, Design, and Optimization of Spiral Inductors and Transformers for Si RF IC's; Ali M. Niknejad et al; IEEE Journal of Solid-State Circuits, vol. 33, No. 10, Oct. 1998.

WP 23.6 A 2.6GHz/5.2GHz CMOS Voltage-Controlled Oscillator; Christopher Lam; 1999 IEEE International Solid-State Circuits Conference; pp. 402-403, 484.

WP 23.8 A 9,8GHz Back-Gate Tuned VCO in 0.35µm CMOS; HongMo Wang; 1999 IEEE International Solid-State Circuits Conference; pp. 406-407, 484.

MP 4.8 A 1.9GHz Micromachined-Based Low-Phase-Noise CMOS VCO; Aleksander Dec et al; 1999 IEEE International Solid-State Circuits Conference; 3 pages.

A 1.24-GHz Monolithic CMOS VCO with Phase Noise of -137 dBc/Hz at a 3-MHz Offset; C.-M. Hung et al; IEEE Microwave and Guided Wave Letters, vol. 9, No. 3, Mar. 1999; pp. 211-213.

A 2.7-V 900-MHz/1.9-GHz Dual-Band Transceiver IC for Digital Wireless Communication; Joo Leong (Julian) Tham et al; IEEE Journal of Solid-State Circuits; vol. 34, No. 3, Mar. 1999; pp. 286-291.

Mismatch Shaping for a Current-Mode Multibit Delta-Sigma DAC; Tao Shui et al; IEEE Journal of Solid-State Circuits; vol. 34, No. 5, Mar. 1999; 9 pages.

A Low-Noise, 900-MHz VCO in 0.6μm CMOS; Chan-Hong Park; IEEE Journal of Solid-State Circuits, vol. 34, No. 5, May 1999; // 586-591.

Modeling of CMOS Digital-to-Analog Converters for Telecommunications; J. Jacob Wikner et al; IEEE Transactions on Circuits and Systems II: Analog and DIgital Signal Processing; vol. 46, No. 5, May 1999; 12 pages.

A 14-bit Intrinsic Accuracy Q2 Random Walk CMOS DAC; Geert A. M. Van der Plas et al; IEEE Journal of Solid-State Circuits, vol. 34, No. 12, Dec. 1999; 6 pages.

TP 12.5 A 1.4GHz Differential Low-Noise CMOS Frequency Synthesizer using a Wideband PLL Architecture; Li Lin; 2000 IEEE International Solid-State Circuits Conference; pp. 204-205, 458.

An All-Analog Multiphase Delay-Locked Loop Using a Replica Delay Line for Wide-Range Operation and Low-Jitter Performance; Yongsam Moon et al; IEEE Journal of Solid-State Circuits, vol. 35, No. 3, Mar. 2000; pp. 377-384.

A 14-Bit Current-Mode ΣΔ DAC Based Upon Rotated Data Weighted Averaging; Russ E. Radke; IEEE Journal of Solid-State Circuits, vol. 35, No. 8, Aug. 2000.

A 333MHz, 20mW, 18ps Resolution Digital DLL using Current-controlled Delay with Parallel Variable Resistor DAC (PVR-DAC); Satoshi Eto et al; Proceedings of the Second IEEE Asia Pacific Conference on ASICs AP-ASIC 2000; Korea; Aug. 28-30, 2000; cover page and pp. 349-350.

A 3 V 10b 100 MS/S Digital-to-Analog Converter for Cable Modem Applications; sueng-Chul Lee et al; Proceedings of the Second IEEE Asia Pacific Conference on ASICs AP-ASIC 2000; Korea; Aug. 28-30, 2000; cover page and pp. 203-205.

WA 18.7 A Combined 10/125Mbaud Twisted-Pair Line Driver with Programmable Performance/Power Features; Ayal Shoval et al; 2000 IEEE International Solid-State Circuits Conference; pp. 314-315.

Gigabit Ethernet PHY Chip Sets LAN Speed Record for CopperStory; Lee Goldberg; Tech Insights; Nov. 16, 1998 6 pages.

A 10-b 70-MS/s CMOS D/A Converter; Yasuyuki Nakamura et al; IEEE Journal of Solid-State Circuits, vol. 26, No. 4, Apr. 1991; pp. 637-642.

A 130-MHz 8-b CMOS Video DAC for HDTV Applications; Joan Michel Fournier and Patrice Senn; Special Brief Papers; IEEE Journal of Solid-State Circuits; vol. 26, No. 7, Jul. 1991.

A 10 bit 80 MHz Glitchless CMOS D/A Converter; Hiroshi Takakura et al; IEEE 1991 Custom Integrated Circuits Conference; 4 pages.

A 10-b 125-MHz CMOS Digital-to-Analog Converter (DAC) with Threshold-Voltage Compensated Current Sources; Shu-Yuan Chin et al; IEEE Journal of Solid-State Circuits, vol. 29, No. 11, Nov. 1994; pp. 1374-1380.

WP 3.2: A 320MHz CMOS Triple 8b DAC with On-Chip PLL and Hardware Cursor; David Reynolds; 1994 IEEE International Solid-State Circuits Conference; pp. 50-51.

A Low Glitch 10-bit 75-MHz CMOS Video D/A Converter; Tien-Yu Wu et al; IEEE Journal of Solid-State Circuits, vol. 30, No. 1; Jan. 1995; pp. 68-72.

An 80-MHz 8-bit CMOS D/A Converter; Takahiro Miki et al; IEEE Journal of Solid-State Circuits, vol. SC-21, No. 6, Dec. 1986; pp. 983-988.

A High-Performance CMOSs 70-MHz Palette/DAC; Lawrence Letham et al; IEEE Journal of Solid-State Circuits, vol. SC-22, No. 6, Dec. 1987; pp. 1041-1047.

Analysis and Design of Analog Integrated Circuits, Third Edition, Paul R. Gray et al; 2 cover pages, pp. 270, 274.

IEEE 100 The Authoritative Dictionary of IEEE Standards; cover page and p. 280.

A 10-b, 500-M Sample/s CMOS DAC in 0.6 mm2; Chi-Hung Lin et al; IEEE Journal of Soild-State Circuits, vol. 33, No. 12, Dec. 1998; pp. 1948-1958.

ISSCC '99 Short Course Information; List of Short Courses offered on Feb. 18, 1999; 3 pages.

4.5 A 0.2-2GHz 12mW Multiplying DLL for Low-Jitter Clock Synthesis in Highly-Integrated Data Communication Chips; Ramin Farjad-rad et al; 2002 IEEE International Solid-State Circuits Conference; 8 pages.

All-Digital Multi-Phase Delay Locked Loop for Internal Timing Generation in Embedded and/or High-Speed DRAMs; Kohtaroh Gotoh et al; 1997 Symposium on VLSI Circuits Digest of Technical Papers; pp. 107-108.

FA 8.1: Low-Jitter and Process-Independent DLL and PLL Based on Self-Biased Techniques; John G. Manealis; 1995 International Solid-State Circuits Conference; 3 pages.

THAM 11.3: A Variable Delay Line Phase Locked Loop for CPU-Coprocessor Synchronization; Mark G. Johnson; 1988 International Solid-State Circuits Conference; Session XI: High-Speed Logic; 4 pages.

FAM 11.6: A Monolithic CMOSs 10MHz DPLL for Burst-Mode Data Retiming; Jeff Sonntag; 1990 IEEE International Solid-State Circuits Conference; Session 11: High-Speed Communication IC's; 3 pages.

A Portable Digital DLL Architecture for CMOS Interface Circuits; Bruno W. Garlepp et al; 1998 Symposium on VLSI Circuits Digest of Technical Papers; pp. 214-215.

An All-Digital Phase-Locked Loop with 50-Cycle Lock Time Suitable for High-Performance Microprocessors; Jim Dunning et al; IEEE Journal of Solid-State Circuits, vol. 30, No. 4, Apr. 1995; pp. 412-422.

A Register-Controlled Symmetrical DLL for Double-Data-Rate DRAM; Feng Lin et al; IEEE Journal of Solid-State Circuits, vol. 34, No. 4, Apr. 1999; pp. 565-568.

A Portable Digital DLL for High-Speed CMOS Interface Circuits; Bruno W. Garlepp et al; IEEE Journal of Solid-State Circuits, vol. 34, No. 5, May 1999; pp. 632-644.

Clock-Deskew Buffer Using a SAR-Controlled Delay-Locked Loop; Guang-Kaai Dehng et al; pp. 1128-1136.

A Low-Power Small-Area ±7.28-ps-Jitter 1-GHz DLL-Based Clock Generator; Ghulwood Kim et al; IEEE Journal of Solid-State Circuits, vol. 37, No. 11, Nov. 2002; pp. 1414-1420.

A Fast-Lock Mixed-Mode DLL Using a 2-b SAR Algorithm; Guang-Kaai Dehng et al; IEEE Journal of Solid-State Circuits, vol. 36, No. 10, Oct. 2001; pp. 1464-1471.

A 2.5 V CMOS Delay-Locked Loop for an 18 Mbit, 500 Megabyte/s DRAM; Thomas H. Lee et al; IEEE Journal of Solid-State Circuits, vol. 29, No. 12, Dec. 1994; pp. 1491-1496.

Principles of Data Conversion System Design; Behzad Razavi; 1995; 139 pages.

An Intuitive Justification and a Simplified Implementation of the MAP Decoder for Convolutional Codes; Andrew J. Viterbi; IEEE Journal on Selected Areas in Communications, vol. 16, No. 2, Feb. 1998; 3 pages.

VLSI Architectures for Iterative Decoders in Magnetic Recording Channels; Engling Yeo et al; IEEE Transactions on Magnetics, vol. 37, No. 2, Mar. 2001; pp. 748-755.

Coding and Iterative Detection for Magnetic Recording Channels; Zining Wu; 2000; 89 pages.

D/A and A/D Converters; Richard C. Dorf; Electrical Engineering Handbook; 1993; 2 cover pages and pp. 771-783.

Computationally Efficient Turbo Decoding with the Bi-directional Viterbi Algorithm (BIVA); Matthew B. Shoemake and Chris Heegard; Cornell University; 1997 IEEE; p. 228.

Computation of the Right-Inverse of G(D) and the Left-Inverse of H(D); Lee; Electronic Letters; Jun. 21, 1990; vol. 26, No. 13; 3 pages.

Digital Logic and Computer Design; M. Morris Mano; 1979; 627 pages.

IEEE Std 802.3-2002 (Revision of IEEE 802.3, 2000 Edition); IEEE Standard for Information technology—Telecommunications and information exchange between systems—local and metropolitan area networks—Specific requirements Part 3: Carrier sense multiple access with collison detection (CSMA/CD) access method and physical layer specifications; Section One; IEEE Computer Society; Sponsored by the LAN/MAN Standards Committee; Mar. 8, 2002; 578 pages.

IEEE Std 802.3-2002 (Revision of IEEE 802.3, 2000 Edition); IEEE Standard for Information technology—Telecommunications and information exchange between systems—local and metropolitan area networks—Specific requirements Part 3: Carrier sense multiple access with collison detection (CSMA/CD) access method and physical layer specifications; Section Two; IEEE Computer Society; Sponsored by the LAN/MAN Standards Committee; Mar. 8, 2002; 582 pages.

IEEE Std 802.Mar. 2002 (Revision of IEEE 802.3, 2000 Edition); IEEE Standard for Information technology—Telecommunications and information exchange between systems—local and metropolitan area networks—Specific requirements Part 3: Carrier sense multiple access with collison detection (CSMA/CD) access method and physical layer specifications; Section Three; IEEE Computer Society; Sponsored by the LAN/MAN Standards Committee; Mar. 8, 2002; 379 pages.

\* cited by examiner

US 7,853,855 B1

HIGH SPEED ITERATIVE DECODER

CROSS-REFERENCE TO RELATED APPLICATIONS

This application is a continuation of U.S. patent application Ser. No. 11/372,821, filed Mar. 10, 2006, (now U.S. Pat. No. 7,577,892, issued Aug. 18, 2009) which claims the benefit of U.S. Provisional Application No. 60/711,164, filed Aug. 25, 2005. The disclosures of the above applications are incorporated herein by reference in their entirety.

FIELD

The present disclosure relates to iterative decoders in digital communication systems.

BACKGROUND

In communication systems it is desirable to accurately transmit as much information as possible through a communication channel for a given amount of transmission power. One method of improving the bandwidth in a communication system is to encode the transmitted data with a forward error-correcting code (FEC). The FEC interleaves the data and generates parity data, which is combined with the interleaved data and transmitted through the communication channel. A receiver includes a decoder that uses the parity data to help recover the data. Whether the decoder successfully recovers the data depends on the depth of the interleaving, the amount of parity data, and the characteristics of noise in the communication channel.

Referring now to FIG. 1, a block diagram is shown of a communication system 10. A first transceiver 12-1 and second transceiver 12-2, collectively referred to as transceivers 12, communicate with each other via a communication channel 14. Transceivers 12 include respective physical layer modules (PHY) 16 that directly interface with communication channel 14. PHYs 16 communicate with FEC encoders 18 and FEC decoders 20. Hosts 22 generate and receive the data that is processed by FEC encoders 18, communicated via communication channel 14, and decoded by FEC decoders 20.

Encoders 18 may employ a FEC such as low-density parity check (LDPC) and/or concatenated codes such as turbo serial-concatenated convolutional codes. Encoders include first, or outer, encoders 26 that encode the data from hosts 22 according to a first codeword. Interleavers 28 interleave encoded data from outer encoders before communicating it to second, or inner, encoders 30. Inner encoders 30 encode the interleaved data according to a second codeword. Inner encoders 30 then communicate the encoded data to PHYs 16 to be transmitted.

Optimal decoding for LDPC and turbo coding is too complicated to be implemented practically. Iterative decoding therefore provides a practical alternative. Iterative decoding is a sub-optimal decoding algorithm with reasonable implementation complexity. Iterative decoding is also referred to as message-parsing since the received message data is parsed between two decoding subsystems.

Decoders 20 include first sub-systems 32 that receive the transmitted data from PHYs 16. First sub-systems 32 communicate decoded data to deinterleavers 34. First sub-systems 32 can also generate one or more signals that indicate how certain first sub-systems 32 are of the accuracy of the data that was sent to deinterleavers 34. Second sub-systems 38 receive the deinterleaved data from deinterleavers 34 and decode it. Second subsystems 38 can provide feedback, or soft result, 40 to outer decoders 32 to improve decoding accuracy.

Referring now to FIG. 2 a flow diagram is shown of data as it passes through first sub-systems 32 and second sub-systems 38. When encoders 18 employ one of the turbo codes, first sub-systems 32 represent first, or outer, decoders and second sub-systems 38 represent second, or inner, decoders. When encoders 18 employ one of the LDPCs, first sub-systems 32 represent all check nodes and the second sub-systems 38 represent all bit nodes.

Data from PHYs 16 enter first sub-systems 32 to be decoded according to the second codeword. The partially decoded data is communicated to second systems 38 to be decoded according to the first codeword. Second subsystems 38 communicate the soft result to first sub-systems 32 for further decoding. This process repeats until second sub-systems 38 generate hard results 42 that are communicated to hosts 22. The number of iterations through first-subsystems 32 and second sub-systems 38 can be predetermined based on a maximum bit error rate (BER) desired in the hard results 42.

Increasing the number of iterations reduces the BER, i.e. increases the accuracy of the decoded data. However, increasing the number of iterations increases a computational burden on decoders 20. In order to maintain decoding throughput with the higher number of iterations the computational throughput of decoders 20 must be increased. This can be achieved by increasing a clock frequency of decoders 20. It should be appreciated however that increasing clock frequencies introduces other issues. These issues include increasing power consumption and/or increasing design complexity due to smaller signal timing margins. There remains a need in the art for a method of increasing the decoding throughput of decoders 20.

SUMMARY

A high-speed decoder includes a buffer that includes buffer space for Q encoded data frames, where Q is a rational number greater than or equal to two. An iterative decoder receives the data frames from the buffer, generates a confidence result with each decoding iteration, and completes decoding a data frame when at least one of the number of iterations reaches a predetermined maximum number of iterations and the confidence result is greater than or equal to a predetermined confidence level. The iterative decoder stops decoding the Q data frames after a predetermined total number of iterations that is less than Q times the predetermined maximum number of iterations.

In other features the predetermined total number of iterations corresponds with a maximum acceptable error rate in decoding the Q data frames. The high speed decoder further includes a clock that drives the iterative decoder and operates at a clock frequency based on an average number of iterations needed for the confidence result to achieve the predetermined confidence level. The high-speed decoder further includes a second buffer that receives decoded data frames from the iterative decoder. The second buffer includes a buffer space having the same size as the buffer space of the first buffer.

In other features a transceiver includes the high-speed decoder and a forward error correction encoder that employs a concatenated code. The high-speed decoder further includes a physical layer module that communicates with an input of the first buffer and that is otherwise compatible with at least one of the Bluetooth standard, Institute of Electrical and Electronics Engineers (IEEE) standard 802.3, 802.3an, 802.11, 802.11a, 802.11b, 802.11g, 802.11h, 802.11n, 802.16, and 802.20.

A high-speed decoding method includes buffering Q data frames, where Q is a rational number greater than or equal to two. The method also includes receiving the data frames from the buffering step, iteratively decoding the data frames, generating a confidence result with each decoding iteration, and completing decoding a data frame when at least one of the number of iterations reaches a predetermined maximum number of iterations and the confidence result is greater than or equal to a predetermined confidence level. The iterative decoding step stops decoding the Q data frames after a predetermined total number of iterations that is less than Q times the predetermined maximum number of iterations.

In other features the predetermined total number of iterations corresponds with a maximum acceptable error rate in decoding the Q data frames. The decoding method also includes clocking the iterative decoding step at a clock frequency based on an average number of iterations needed for the confidence result to achieve the predetermined confidence level. The high-speed decoding method also includes receiving the decoded data frames from the iterative decoding step and buffering the decoded data frames. The step of buffering the decoded data frames includes maintaining a buffer space having a same size as a buffer space used in the step of buffering Q data frames. The high-speed decoding method also includes receiving the Q data frames according to at least one of the Bluetooth standard, Institute of Electrical and Electronics Engineers (IEEE) standard 802.3, 802.3an, 802.11, 802.11a, 802.11b, 802.11g, 802.11h, 802.11n, 802.16, and 802.20, and communicating the received Q data frames to the buffering step.

A high-speed decoder includes buffer means for buffering Q encoded data frames, where Q is a rational number greater than or equal to two. The high-speed decoder also includes iterative decoder means for receiving the data frames from the buffer means, generating a confidence result with each decoding iteration, and completing decoding a data frame when at least one of the number of iterations reaches a predetermined maximum number of iterations and the confidence result is greater than or equal to a predetermined confidence level. The iterative decoder means stops decoding the Q data frames after a predetermined total number of iterations that is less than Q times the predetermined maximum number of iterations.

In other features the predetermined total number of iterations corresponds with a maximum acceptable error rate in decoding the Q data frames. The high-speed decoder also includes clock means for driving the iterative decoder means and at a clock frequency based on an average number of iterations needed for the confidence result to achieve the predetermined confidence level. The high-speed decoder also includes second buffer means for receiving decoded data frames from the iterative decoding means. The second buffer means includes a buffer space having the same size as the buffer space of the first buffer means. The high-speed decoder also includes physical layer means for communicating with an input of the first FIFO means and that is otherwise compatible with at least one of the Bluetooth standard, Institute of Electrical and Electronics Engineers (IEEE) standard 802.3, 802.3an, 802.11, 802.11a, 802.11b, 802.11g, 802.11h, 802.11n, 802.16, and 802.20.

In still other features, the systems and methods described above are implemented by a computer program executed by one or more processors. The computer program can reside on a computer readable medium such as but not limited to memory, non-volatile data storage and/or other suitable tangible storage mediums.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

Figure 1:
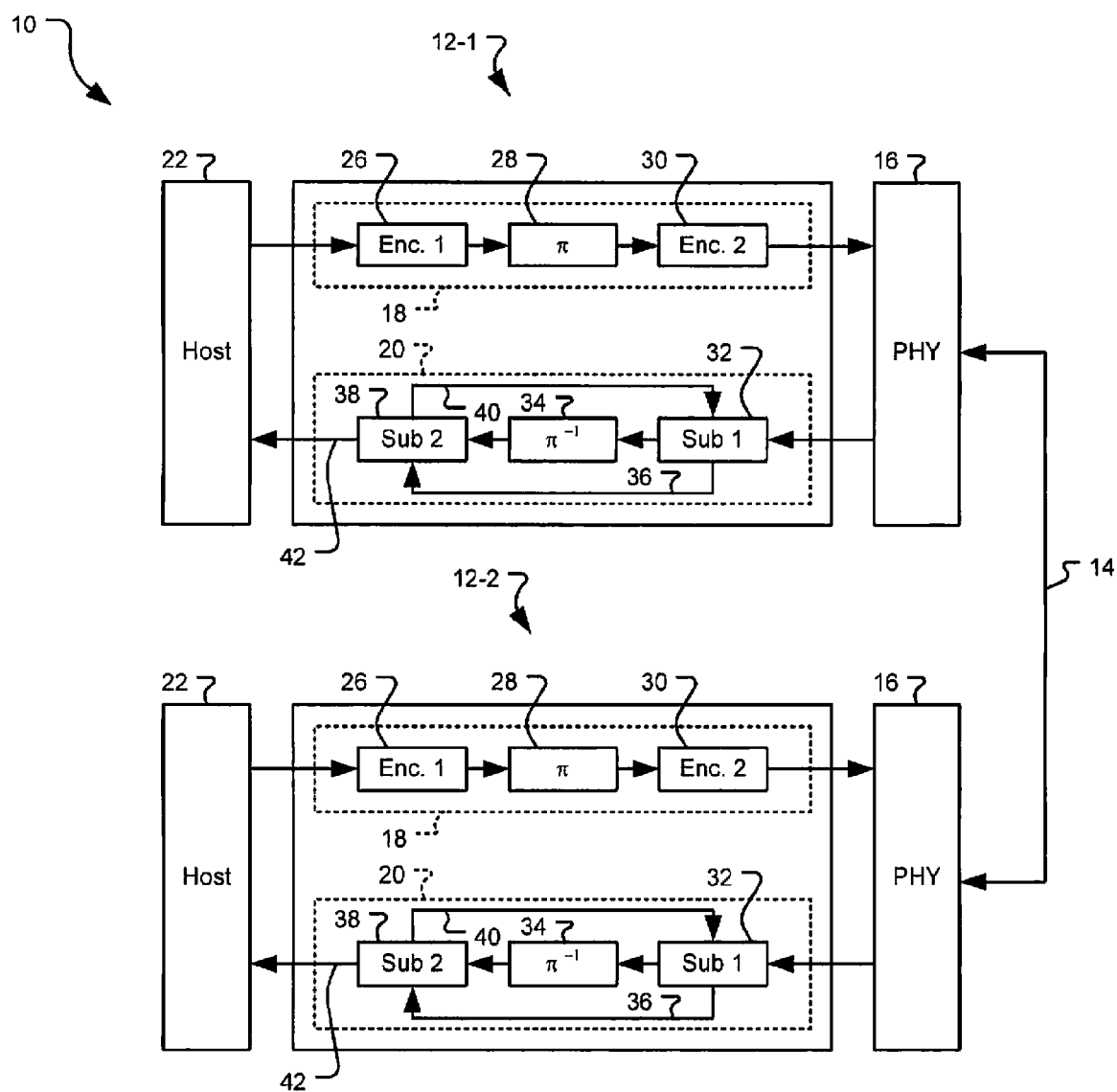
FIG. 1 is a functional block diagram of a digital communications system of the prior art.
Figure 2:
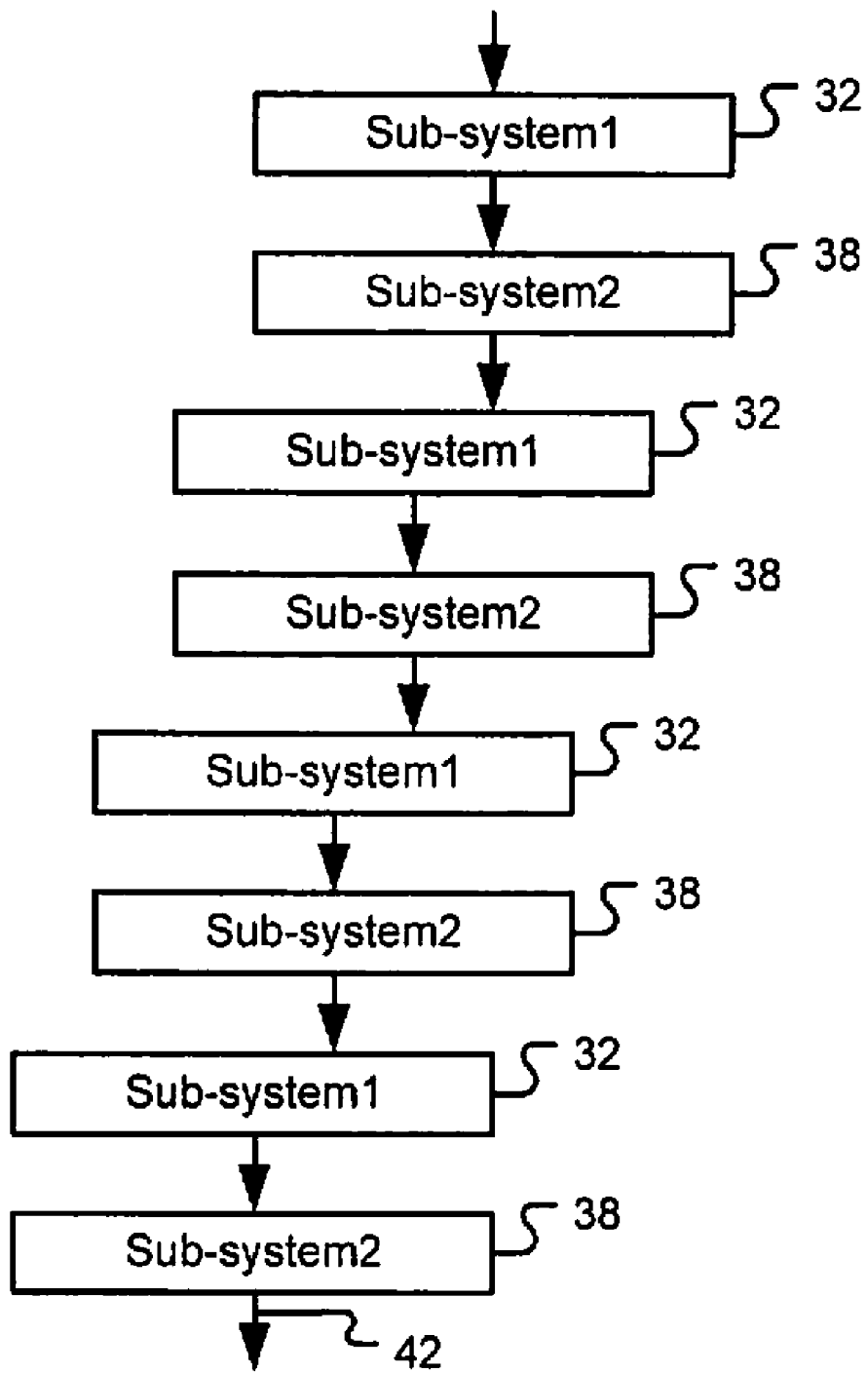
FIG. 2 is a flow diagram of an iterative decoding method of the prior art.

The following description is merely exemplary in nature and is in no way intended to limit the disclosure, its application, or uses. For purposes of clarity, the same reference numbers will be used in the drawings to identify similar elements. As used herein, the term module, circuit and/or device refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3:
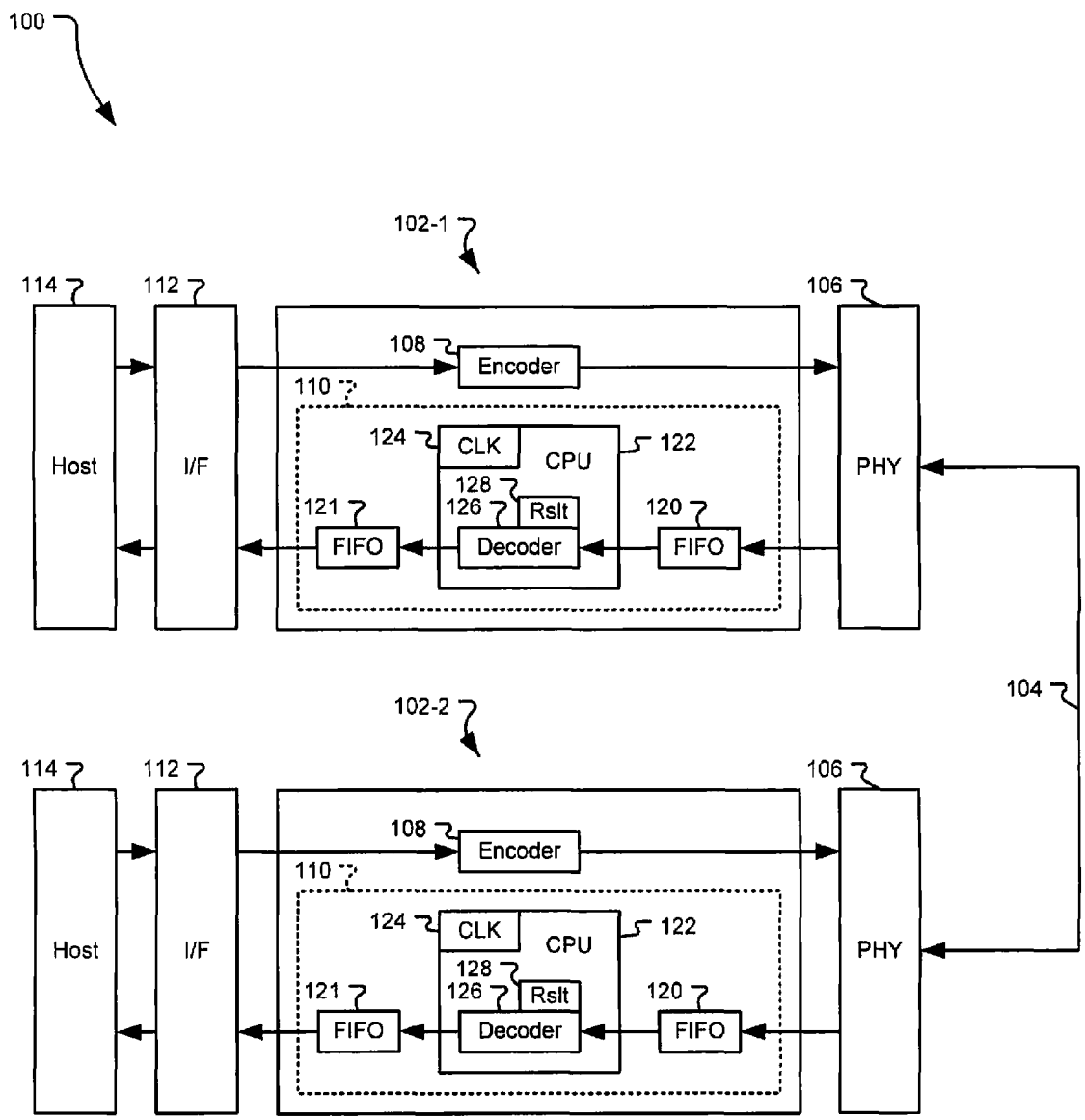
FIG. 3. is a functional block diagram of digital communication transceivers with improved decoders.

Referring now to FIG. 3, an improved digital communications system 100 is shown. A first transceiver 102-1 and a second transceiver 102-2, collectively referred to as transceivers 102, communicate through a communications channel 104. Communications channel 104 can include one or more of wired, fiber-optic, and/or wireless channels. Transceivers 102 can be compliant with at least one of the Institute of Electrical and Electronics Engineers (IEEE) standards 802.3, 802.3an, 802.11, 802.11a, 802.11b, 802.11g, 802.11h, 802.11n, 802.16, and 802.20, and/or the Bluetooth standard published by the Bluetooth Special Interest Group (SIG). The aforementioned standards are hereby incorporated by reference in their entirety.

Transceivers 102 include PHYs 106 that provide an interface to the communication channel 104. PHYs 106 also communicate with encoders 108 and decoder channels 110. Interface modules 112 provide an interface between hosts 114 and associated encoders 108 and decoder channels 110.

Examples of hosts 114 include various computers, servers, voice-over-internet protocol (VoIP) telephones, digital video servers, digital video displays, and/or other devices.

Encoders 108 employ concatenated codes. Decoder channels 110 include input first-in, first-out buffers (FIFOs) 120 and output FIFOs 121 that communicate with respective inputs and outputs of central processing units (CPU) 122. In some embodiments FIFOs 120, 121 include sufficient memory space to buffer Q data frames received through the communication channel 104. Q is a real number greater than 2. If N represents a number of bits in each data frame then the buffer memory size is Q*N bits.

CPUs 122 are driven by a clock 124 that operates at a clock frequency. The clock frequency is determined based on methods described below and affects power consumption, signal timing tolerances, and operating speed of CPUs 122. CPUs 122 implement iterative decoders 126 which employ LDPC and/or turbo decoding schemes.

Each iterative decoder 126 generates a confidence result 128 with each decoding iteration. CPU 122 compares confidence result 128 to a predetermined value to determine whether iterative decoder 126 has decoded the data frame to a desired degree of accuracy. Iterative decoder 126 continues iteratively decoding the present data frame until the desired degree of accuracy is reached. Iterative decoder 126 stops decoding the present data frame if confidence result 128 does not achieve the predetermined value within a predetermined maximum number of iterations. When iterative decoder 126 stops decoding the present data frame it sends the corresponding decoded data frame to output FIFO 121 and reads the next data frame from input FIFO 120. When the iterative decoder 126 implements the LDPC scheme then confidence result 128 can be compared to a parity check metric. When iterative decoder 126 implements the turbo-decoder scheme then confidence result 128 can be compared to a generator polynomial.

Figure 4:
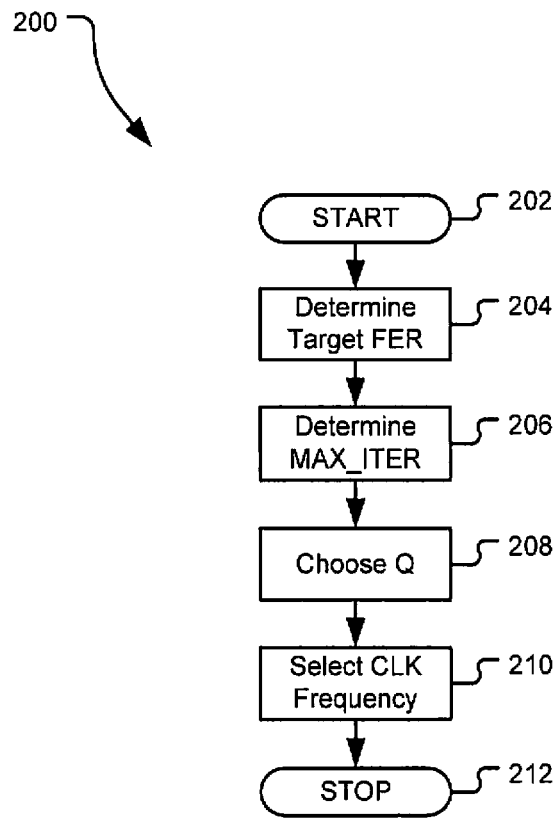
FIG. 4 is a flowchart of an improved iterative decoding method.

Referring now to FIG. 4, a flowchart is shown of a method 200 for determining Q and the frequency of clock 124. A working example is also provided after the following description of method 200. Control begins in block 202 and immediately proceeds to block 204. In block 204 control chooses a target frame error rate (FER) for data frames that are received through channel 104. Control then proceeds to block 206 and determines a number of iterations, MAX_ITER, of the iterative decoders 126 that would be necessary to achieve the target FER. The frequency of clock 124 is then determined based on MAX_ITER and a frame transmission rate through channel 104. Control then proceeds to block 208 and selects Q>2. Control then proceeds to block 210 and selects a new clock frequency based on an average number of iterations through iterative decoders 126 that would be necessary to stay within the target FER. Control then exits though block 212.

A working example will now be described. The target FER in block 204 is chosen to be $10^{-12}$. In this example it is assumed that iterative decoders 126 provide an FER of $10^{-5}$ after three iterations, an FER of $10^{-8}$ after four iterations, and an FER of $10^{-12}$ FER after five iterations. If Q is chosen to be 2, then two consecutive frames can be stored in FIFOs 120 and 121. One of the consecutive frames has a probability of $10^{-8}$ of needing more than four iterations. The probability of the other frame needing more than three iterations is then $10^{-5}$. If the frequency of clock 124 decoder clock is selected such that iterative decoder 126 can perform four iterations per frame, then the overall probability of erroneously decoding data due a FIFO overflow of Q consecutive frames is $10^{-8}*10^{-5}=10^{-13}$. This means that the frequency of clock 124 can be reduced by 20% due to the reduction from five iterations per frame to four iterations per frame on average. The FIFOs 120 and 121 thereby allow decoder channels 110 to consume less power than other decoder channels that do not use FIFOs 120 and 121. Similarly, FIFOs 120 and 121 allow decoder channels 110 to process a greater number of frames per unit time for a given frequency of clock 124. Therefore the disclosed decoder arrangement uses large enough FIFOs such that the frequency of clock 124 can be set for the average number of iterations per frame instead of the maximum number of iterations per frame.

Figure 5A:
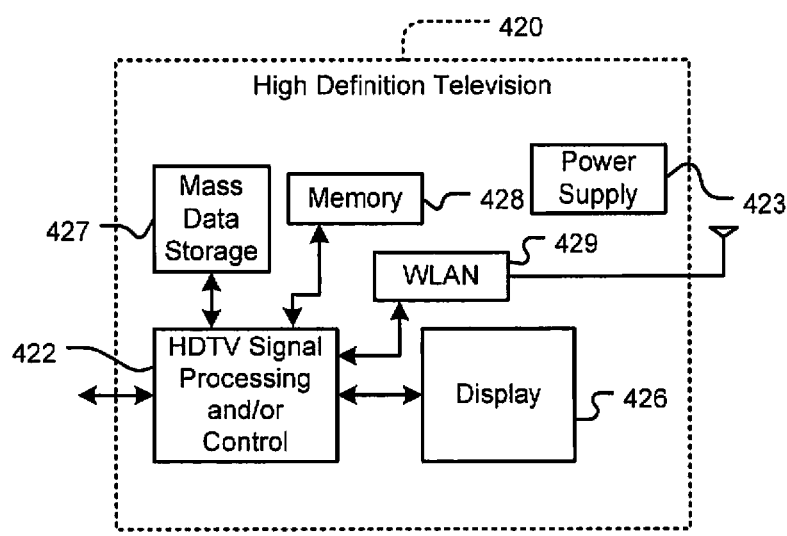
FIG. 5A is a functional block diagram of a high definition television.

Referring now to FIGS. 5A-5E various exemplary implementations of the present invention are shown. Referring now to FIG. 5A, the present invention can be implemented in a high definition television (HDTV) 420. The present invention may implement and/or be implemented in a wireless local area network (WLAN) interface 429. The HDTV 420 receives HDTV input signals in either a wired or wireless format and generates HDTV output signals for a display 426. In some implementations, a signal processing circuit and/or control circuit 422 and/or other circuits (not shown) may process data, perform coding and/or encryption, perform calculations, format data and/or perform any other type of HDTV processing that may be required.

The HDTV 420 may communicate with mass data storage 427 that stores data in a nonvolatile manner such as optical and/or magnetic storage devices. The mass data storage 427 may include optical and/or magnetic storage devices for example hard disk drives HDD and/or DVDs. Mass data storage 427 may include at least one HDD and/or least one DVD. The HDD may be a mini HDD that includes one or more platters having a diameter that is smaller than approximately 1.8". The HDTV 420 may be connected to memory 428 such as RAM, ROM, low latency nonvolatile memory such as flash memory and/or other suitable electronic data storage. The HDTV 420 also may support connections with a WLAN via the WLAN interface 429. The HDTV 420 also includes a power supply 423.

Figure 5B:
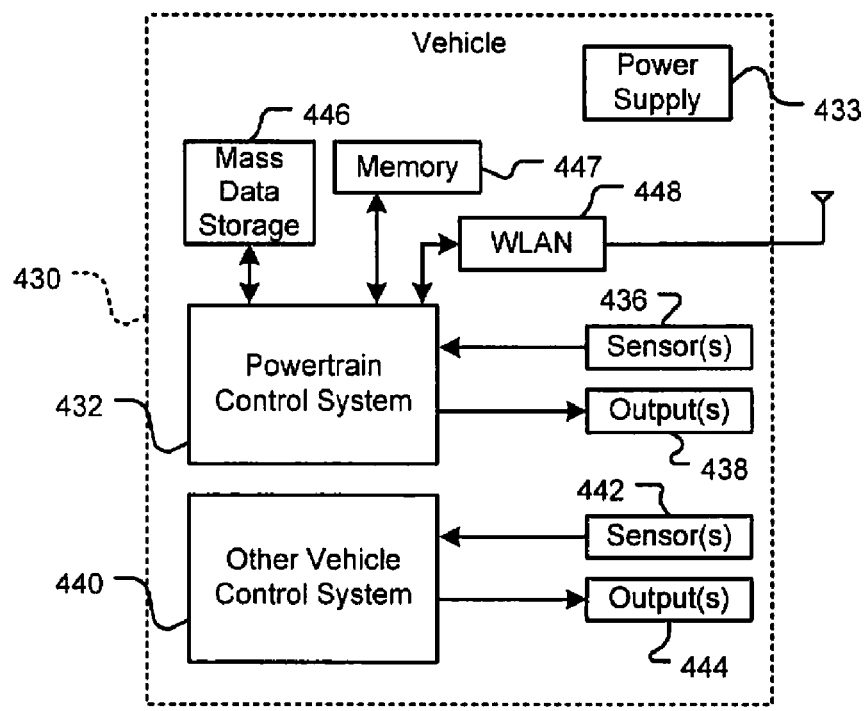
FIG. 5B is a functional block diagram of a vehicle control system.

Referring now to FIG. 5B, the present invention may be implemented in a WLAN interface 448 of a vehicle 430. Vehicle 430 includes a powertrain control system 432 that receives inputs from one or more sensors 436 such as temperature sensors, pressure sensors, rotational sensors, airflow sensors and/or any other suitable sensors and/or that generates one or more output control signals 438 such as engine operating parameters, transmission operating parameters, and/or other control signals.

The present invention may also be implemented in other control systems 440 of the vehicle 430. The control system 440 may likewise receive signals from input sensors 442 and/or output control signals to one or more output devices 444. In some implementations, the control system 440 may be part of an anti-lock braking system (ABS), a navigation system, a telematics system, a vehicle telematics system, a lane departure system, an adaptive cruise control system, a vehicle entertainment system such as a stereo, DVD, compact disc and the like. Still other implementations are contemplated.

The powertrain control system 432 may communicate with mass data storage 446 that stores data in a nonvolatile manner. The mass data storage 446 may include optical and/or magnetic storage devices for example hard disk drives HDD and/or DVDs. Mass data storage 446 may include at least one HDD and/or least one DVD. The HDD may be a mini HDD that includes one or more platters having a diameter that is smaller than approximately 1.8". The powertrain control system 432 may be connected to memory 447 such as RAM, ROM, low latency nonvolatile memory such as flash memory and/or other suitable electronic data storage. The powertrain control system 432 also may support connections with a WLAN via the WLAN interface 448. The control system 440 may also include mass data storage, memory and/or a WLAN interface (all not shown). The vehicle 430 also includes a power supply 433.

Figure 5C:
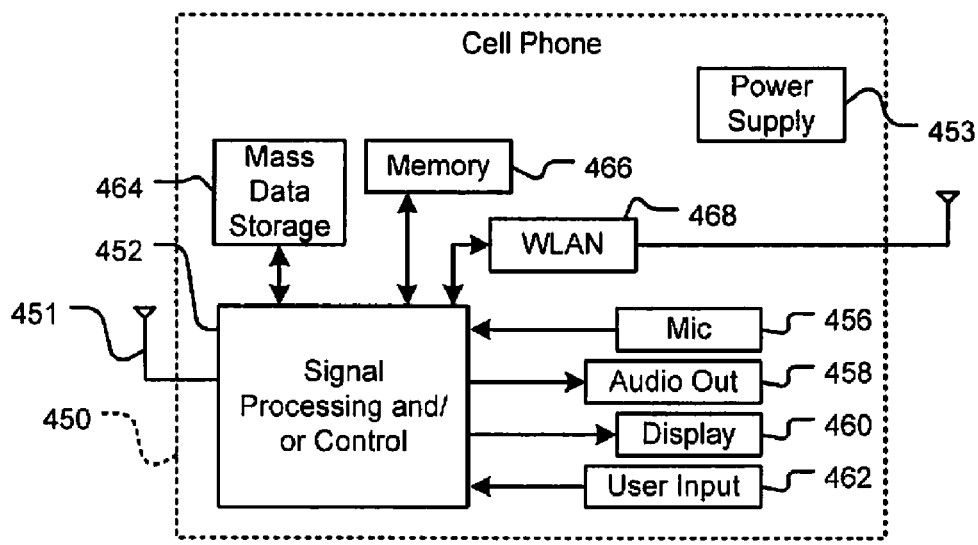
FIG. 5C is a functional block diagram of a cellular phone.

Referring now to FIG. 5C, the present invention can be implemented in a cellular phone 450 that may include a cellular antenna 451. The invention may be implemented in a WLAN interface 468. In some implementations, the cellular phone 450 includes a microphone 456, an audio output 458 such as a speaker and/or audio output jack, a display 460 and/or an input device 462 such as a keypad, pointing device, voice actuation and/or other input device. Signal processing and/or control circuits 452 and/or other circuits (not shown) in the cellular phone 450 may process data, perform coding and/or encryption, perform calculations, format data and/or perform other cellular phone functions.

The cellular phone 450 may communicate with mass data storage 464 that stores data in a nonvolatile manner such as optical and/or magnetic storage devices for example hard disk drives HDD and/or DVDs. The HDD may be a mini HDD that includes one or more platters having a diameter that is smaller than approximately 1.8". The cellular phone 450 may be connected to memory 466 such as RAM, ROM, low latency nonvolatile memory such as flash memory and/or other suitable electronic data storage. The cellular phone 450 also may support connections with a WLAN via the WLAN interface 468. Cellular phone 450 also includes a power supply 453.

Figure 5D:
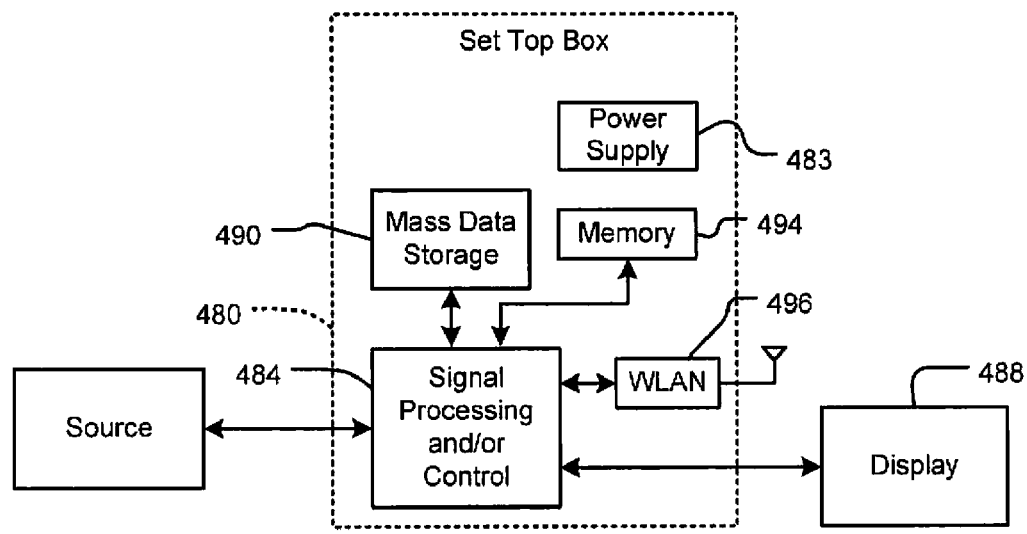
FIG. 5D is a functional block diagram of a set top box.

Referring now to FIG. 5D, the present invention can be implemented in a set top box 480. The present invention may be implemented in a WLAN interface 496 of the set top box 480. The set top box 480 receives signals from a source such as a broadband source and outputs standard and/or high definition audio/video signals suitable for a display 488 such as a television and/or monitor and/or other video and/or audio output devices. The signal processing and/or control circuits 484 and/or other circuits (not shown) of the set top box 480 may process data, perform coding and/or encryption, perform calculations, format data and/or perform any other set top box function.

The set top box 480 may communicate with mass data storage 490 that stores data in a nonvolatile manner. The mass data storage 490 may include optical and/or magnetic storage devices for example hard disk drives HDD and/or DVDs. The HDD may be a mini HDD that includes one or more platters having a diameter that is smaller than approximately 1.8". The set top box 480 may be connected to memory 494 such as RAM, ROM, low latency nonvolatile memory such as flash memory and/or other suitable electronic data storage. The set top box 480 also may support connections with a WLAN via the WLAN interface 496. The set top box 480 includes a power supply 483.

Figure 5E:
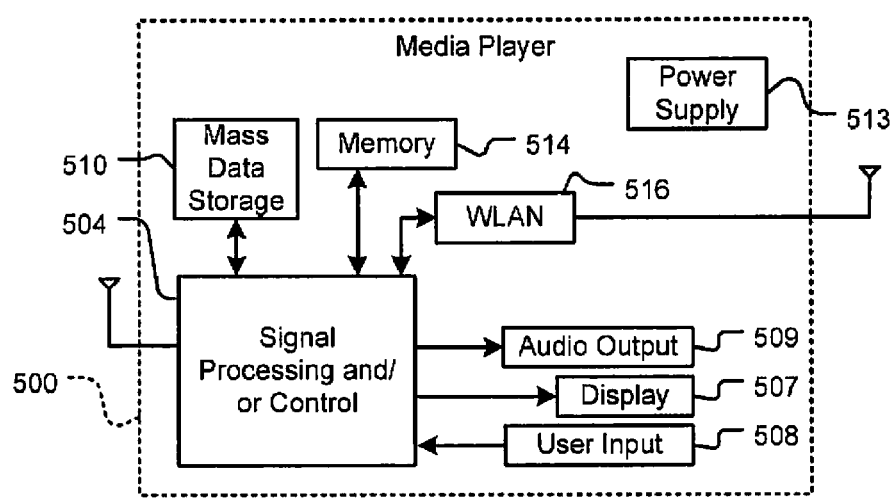
FIG. 5E is a functional block diagram of a media player.

Referring now to FIG. 5E, the present invention can be implemented in a media player 500. The present invention may be implemented in a WLAN interface 516 of the media player 500. In some implementations, the media player 500 includes a display 507 and/or a user input 508 such as a keypad, touchpad and the like. In some implementations, the media player 500 may employ a graphical user interface (GUI) that typically employs menus, drop down menus, icons and/or a point-and-click interface via the display 507 and/or user input 508. The media player 500 further includes an audio output 509 such as a speaker and/or audio output jack. Signal processing and/or control circuits 504 and/or other circuits (not shown) of the media player 500 may process data, perform coding and/or encryption, perform calculations, format data and/or perform any other media player function.

The media player 500 may communicate with mass data storage 510 that stores data such as compressed audio and/or video content in a nonvolatile manner. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". The media player 500 may be connected to memory 514 such as RAM, ROM, low latency nonvolatile memory such as flash memory and/or other suitable electronic data storage. The media player 500 also may support connections with a WLAN via the WLAN interface 516. The media player 500 also includes a power supply 513. Still other implementations in addition to those described above are contemplated. For example, the WLAN interfaces can be replaced and/or supplemented with wired and/or fiber-optic network interfaces.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A system comprising:
a clock having a clock frequency;
a first buffer configured to buffer a plurality of encoded data frames; and
an iterative decoder configured to
iteratively decode, in accordance with the clock frequency, a first encoded data frame of the plurality of encoded data frames buffered in the first buffer, wherein for each decoding iteration, the iterative decoder
generates a confidence result; and
performs a comparison of the confidence result to a predetermined value; and
stop iteratively decoding the first encoded data frame (i) based on the comparison of the confidence result to the predetermined value or (ii) based on a total number of decoding iterations,
wherein the clock frequency of the clock is based on a total number of encoded data frames buffered in the first buffer.

2. The system of claim 1, wherein the clock frequency of the clock is further based on an average number of decoding iterations needed for the confidence result to achieve the predetermined value.

3. The system of claim 1, further comprising a second buffer configured to receive decoded data frames from the iterative decoder.

4. The system of claim 3, wherein the second buffer has a same memory space as the first buffer.

5. The system of claim 1, further comprising a physical layer module in communication with the first buffer.

6. The system of claim 5, wherein the physical layer module is compatible with at least one standard from a group consisting of a Bluetooth standard; and Institute of Electrical and Electronics Engineers (IEEE) standards 802.3, 802.3an, 802.11, 802.11a, 802.11b, 802.11g, 802.11h, 802.11n, 802.16, and 802.20.

7. A transceiver comprising:
the system of claim 5; and
a forward error correction encoder configured to employ a low-density parity check (LDPC) code or a concatenated code.

8. A method comprising:
buffering, in a first buffer, a plurality of encoded data frames; and
iteratively decoding, in accordance with a clock frequency, first encoded data frame of the plurality of encoded data frames buffered in the first buffer, wherein each decoding iteration comprises
generating a confidence result; and
performing a comparison of the confidence result to a predetermined value; and
stopping the iterative decoding of the first encoded data frame (i) based on the comparison of the confidence result to the predetermined value or (ii) based on a total number of decoding iterations,
wherein the clock frequency is based on a total number of encoded data frames buffered in the first buffer.

9. The method of claim 8, wherein the clock frequency is further based on an average number of decoding iterations needed for the confidence result to achieve the predetermined value.

10. The method of claim 8, further comprising clocking the iterative decoding step at a clock frequency based on an average number of iterations needed for the confidence result to achieve the predetermined value.

11. The method of claim 8, further comprising further comprising buffering, in a second buffer, decoded data frames.

12. The method of claim 11, wherein the second buffer has a same memory space as the first buffer.

* * * * *